US012249263B2

(12) United States Patent
Babecki et al.

(10) Patent No.: US 12,249,263 B2
(45) Date of Patent: *Mar. 11, 2025

(54) DERIVATIVE-BASED ENCODING FOR SCANNING MIRROR TIMING

(71) Applicant: Microsoft Technology Licensing, LLC, Redmond, WA (US)

(72) Inventors: Christopher Michael Babecki, Seattle, WA (US); Ryan Scott Haraden, Duvall, WA (US); Jingyang Xue, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 493 days.

This patent is subject to a terminal disclaimer.

(21) Appl. No.: 17/647,762

(22) Filed: Jan. 12, 2022

(65) Prior Publication Data

US 2022/0139281 A1 May 5, 2022

Related U.S. Application Data

(63) Continuation of application No. 16/998,511, filed on Aug. 20, 2020, now Pat. No. 11,227,520.

(51) Int. Cl.
*G09G 3/02* (2006.01)
*G02B 26/10* (2006.01)
*H03M 7/40* (2006.01)

(52) U.S. Cl.
CPC ........... *G09G 3/025* (2013.01); *G02B 26/101* (2013.01); *H03M 7/40* (2013.01);
(Continued)

(58) Field of Classification Search
CPC ........ G09G 3/025; G02B 26/101; H03M 7/40
See application file for complete search history.

(56) References Cited

U.S. PATENT DOCUMENTS

2004/0004585 A1* 1/2004 Brown ..................... G09G 3/02
345/32
2017/0070714 A1* 3/2017 Honkanen ............. G09G 5/005
(Continued)

OTHER PUBLICATIONS

"International Search Report and Written Opinion Issued in PCT Application No. PCT/US21/030990", Mailed Date: Aug. 25, 2021, 15 Pages.

*Primary Examiner* — Jonathan R Messmore
(74) *Attorney, Agent, or Firm* — Alleman Hall & Tuttle LLP

(57) ABSTRACT

One example provides, on a scanning mirror display system, a method for communicating timing information for light samples that are scanned to form a displayed image. The method comprises, for a line of light samples, encoding timing information for a first light sample of the line of light samples using a first, greater number of bits to form encoded timing information for the first light sample. The method further comprises encoding timing information for a subsequent light sample of the line of light samples by computing a derivative based upon a timing of the subsequent light sample compared to a prior light sample, encoding the derivative using a second, lesser number of bits to form encoded timing information for the subsequent light sample, and sending the information for the first light sample and the subsequent light sample across the communications channel.

20 Claims, 8 Drawing Sheets

(52) U.S. Cl.
CPC ..... *G09G 2310/08* (2013.01); *G09G 2350/00* (2013.01); *G09G 2370/00* (2013.01)

(56) References Cited

U.S. PATENT DOCUMENTS

| | | | |
|---|---|---|---|
| 2019/0094667 A1* | 3/2019 | Morarity | G02B 26/122 |
| 2019/0373140 A1* | 12/2019 | Gudaitis | G09G 5/18 |
| 2020/0184686 A1* | 6/2020 | Jung | G01C 21/3664 |

* cited by examiner

ENCODING SCHEME 300

| RAW TIMESTAMP 302 | 1000; 1115; 1227; 1338; 1449; 1560; 1672; 1786; ... |
|---|---|
| 1ST DERIVATIVE 304 | (1000); +115; +112; +111; +111; +111; +112; +114; ... |
| 2ND DERIVATIVE 306 | (1000); (115); -3; -1; 0; 0; +1; +2; ... |

FIG. 3

CODEBOOKS 400

CODEBOOK 410

| 2ND DERIVATIVE | HUFFMAN CODE |
|---|---|
| +1 | 00 |
| -1 | 01 |
| +0 | 100 |
| +2 | 101 |
| +3 | 1100 |
| -2 | 1101 |
| -3 | 1110 |
| ESC | 1111 |

CODEBOOK 420

| 2ND DERIVATIVE | HUFFMAN CODE |
|---|---|
| +1 | 000 |
| -1 | 001 |
| +0 | 010 |
| +2 | 011 |
| +3 | 1000 |
| +4 | 1001 |
| +5 | 1010 |
| -2 | 1011 |
| -3 | 1100 |
| -4 | 1101 |
| -5 | 1110 |
| ESC | 1111 |

ADDITIONAL CODEBOOK 430

FIG. 4

| 2ND DERIVATIVE 500 | -3; -1; -1; -1; -1; -1; 0; 0; +1; +1 +1 +2; ... |
|---|---|
| ENCODED 2ND DERIVATIVE 502 | 1110 01 01 01 01 01 100 100 00 00 00 101 ... |

FIG. 5

DERIVATIVE-BASED ENCODING FOR SCANNING MIRROR TIMING

CROSS REFERENCE TO RELATED APPLICATIONS

This application is a continuation of U.S. patent application Ser. No. 16/998,511, filed Aug. 20, 2020, the entirety of which is hereby incorporated herein by reference for all purposes.

BACKGROUND

In a scanning display system, laser light is reflected by a scanning mirror system to scan a projected image. Laser pulses are synchronized with the motion of the scanning mirror to display pixels of the image. In some such devices, the scanning of the mirror may be performed via harmonic oscillation at a resonant frequency of the mirror.

SUMMARY

Examples are disclosed that relate to synchronizing mirror motion with light pulse timing in scanning mirror display systems. One example provides, on a scanning mirror display system, a method for communicating timing information for light samples that are scanned to form a displayed image. The method comprises, for a line of light samples, encoding timing information for a first light sample of the line of light samples using a first, greater number of bits to form encoded timing information for the first light sample, and sending intensity information and the encoded first timing information for the first light sample across a communications channel. The method further comprises encoding timing information for a subsequent light sample of the line of light samples by computing a derivative based upon a timing of the subsequent light sample compared to a prior light sample, encoding the derivative using a second, lesser number of bits to form encoded timing information for the subsequent light sample, and sending intensity information and the encoded timing information for the subsequent light sample across the communications channel.

Another example provides a scanning mirror display system comprising one or more light sources, a resonant scanning mirror configured to scan light from the one or more light sources across a field of view with a variable speed that is a function of mirror scanning angle, a communication subsystem, a logic subsystem configured to execute instructions, and a storage subsystem holding instructions that are executable to send, via the communications subsystem, sample information for a mirror scan line, the sample information comprising timings encoded using a derivative-based encoding scheme, monitor an encoding progress, and based at least upon a comparison of the encoding progress to a remaining time before a next mirror scan line, send a scan line termination command.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3 shows example timing information for a scan line being encoded using a derivative-based encoding scheme.

FIG. 4 shows example codebooks for encoding second-derivative information using a variable length encoding scheme.

FIG. 5 shows example second derivative timing information encoded via a variable length encoding scheme.

DETAILED DESCRIPTION

In a spatial light modulating display, such as an LCD or OLED panel display, rendered image data is provided to the display hardware as color intensity information (an RGB value). As the positions of the pixels are fixed by hardware in such a display, the location of each pixel can be inferred from the transmission order, with the first data received associated with the pixel in one corner of the display, and subsequent data corresponding to pixels in a fixed pattern across the rest of the display. However, in a scanning mirror display system that utilizes a resonant scanning mirror, the frequency of the scanning device may not be a perfect multiple of the display refresh rate. As such, timing information to coordinate the display's light pulses with the mirror position may be explicitly communicated from the renderer to the display engine to help ensure that each pixel is displayed in a correct location.

However, transmitting both color and timing information uncompressed can utilize a large amount of bandwidth due to a level of accuracy targeted for pixel spacing (e.g. $\frac{1}{32}$ to $\frac{1}{80}$ the distance between pixels in some examples). The transmission of such data may utilize a significant amount of power, and can complicate system design (e.g. due to increased routing complexity from extra data lanes) and/or silicon design complexity (e.g. due to increased frequency). Power considerations also may be important in wearable heads-up displays that utilize small, lightweight batteries.

Accordingly, examples are disclosed that relate to lossless compression schemes for transmitting timing information along with color intensity information for pixels in a scanning mirror display device. Briefly, timing information is encoded for at least some pixels using a derivative-based algorithm. In a resonant scanning mirror system, mirror speed does not change drastically throughout much of the scan. As such, the second derivatives of mirror position as a function of time may be relatively small throughout much of the scan, and thus may be compressed using a much smaller number of bits than unencoded, raw timing information. Further, the second derivatives may be compressed using a variable-length code book. In some examples, compression ratios of the timing data may be 8× or greater when such a scheme is used. In some such examples, compression ratios up to 20× may be achieved. This allows color levels and timing information to be transmitted using a smaller amount of bandwidth than where raw timing information is sent for each pixel, which may lead to comparative power savings.

Figure 1:
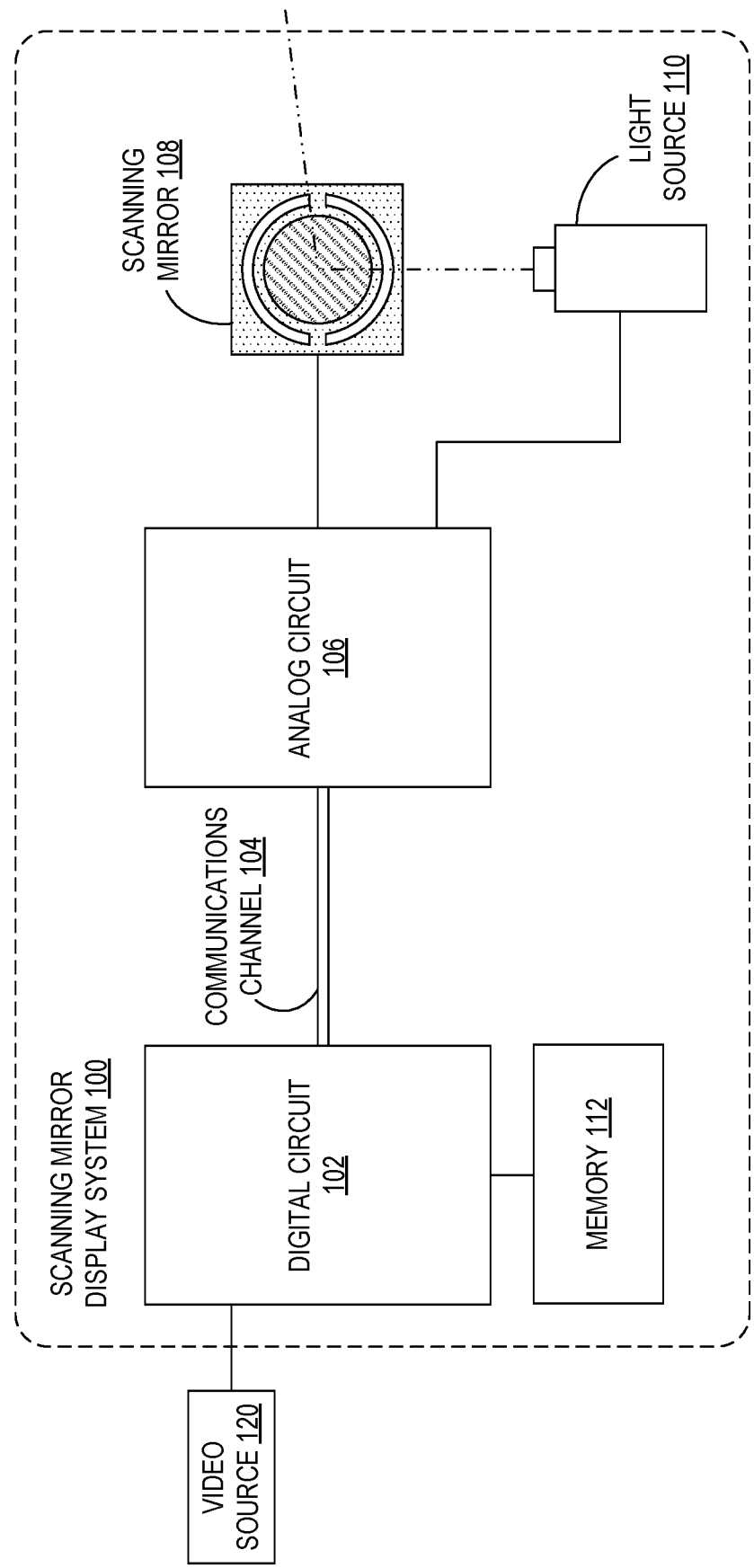
FIG. 1 schematically shows an example scanning mirror display system.

FIG. 1 shows a block diagram of an example scanning mirror display system 100 configured to raster-scan laser light to produce images. System 100 comprises a digital circuit 102 configured to receive image data from a video source 120. Digital circuit 102 translates the image data received into mirror control information and light source control information, which comprises intensity and timing information. Digital circuit 102 then sends intensity and timing information across communication channel 104 to analog circuit 106. Digital circuit 102 may comprise, for example, a digital image processor which receives image data from a video source 120. The analog circuit 106 may comprise an integrated light source driver circuit that drives scanning mirror 108 and light source 110. Light source 110 may include any suitable light emitting element, such as one or more lasers. Light source 110 may output light in any suitable wavelength ranges—e.g., red, green, and blue wavelengths for producing color images. In other examples, light source 110 may output substantially monochromatic light. Scanning mirror display system may also comprise memory 112 storing processing instructions, encoding schemes, and/or other instructions accessible by digital circuit 102. Digital circuit 102 and analog circuit 106 may each comprise separate internal clocks and may therefore send clock synchronization information across communication channel 104 in some examples.

As scanning mirror 108 oscillates, light pulses from light source 110 are directed to different locations on a display screen, optical component, viewer's retina, or other image plane. In some examples, scanning mirror 108 is a 2D scanning mirror oscillating in two dimensions to raster-scan an image horizontally and vertically. In other examples, scanning mirror display system may comprise two scanning mirrors scanning in different dimensions (e.g. horizontal and vertical). In either case, the mirror or mirrors oscillate in a fast scan direction (e.g., horizontal) and a slow scan direction (e.g., vertical). Where the mirror is driven at a harmonic frequency, the fast scan oscillations comprise an approximate sine wave function, while the vertical scans comprise a sawtooth-like function. Combined, these scanning patters allow the display system to raster-scan an image line-by-line.

Figure 2:
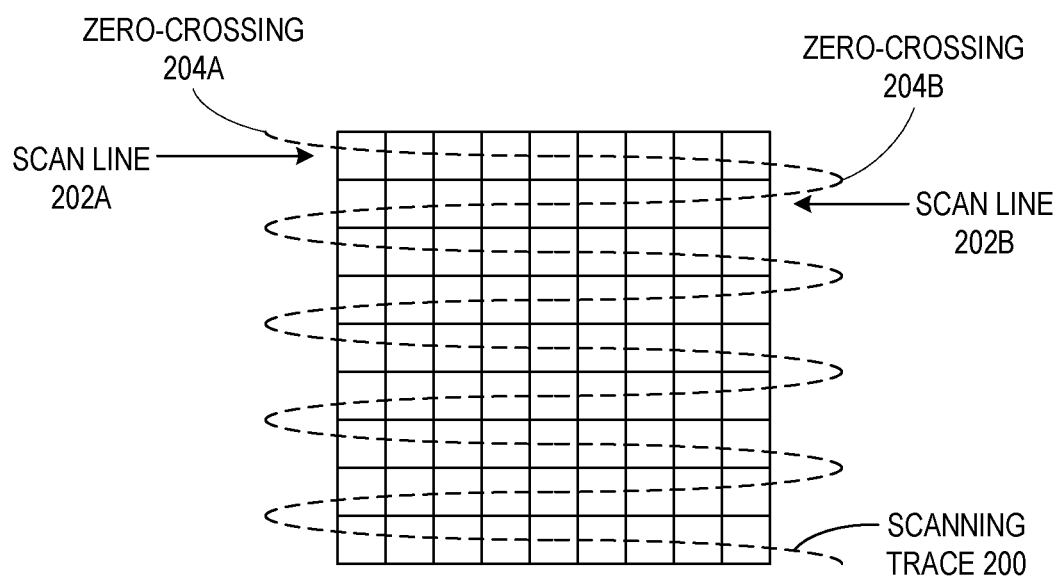
FIG. 2 shows an example scan trace through an image.

FIG. 2 shows an example scan trace 200 for a scanning mirror display system, such as scanning mirror 108. The sinusoidal horizontal motion and sawtooth-like vertical motion illustrated in this example may be controlled, for example, by analog circuit 106. The scan trace 200 begins at the top left and scans the top scan line 202A from left to right. The term "scan line" as used herein refers to one line of pixels in the fast scan direction. The scan trace 200 then scans the next scan line 202B from right to left, continuing back and forth until all scan lines have been scanned. The extrema are termed zero-crossings. Each zero crossing provides a reference time to which all light pulses in the next scan line can be referenced. For example, zero-crossing 204A provides a reference time for the light pulses of scan line 202A. Likewise, zero-crossing 204B provides a reference time for the light pulses of scan line 202B.

As the mirror traverses across each scan line, light pulses are output by light source 110. The timings of the light pulses are synchronized to the motion of the scanning mirror such that each pulse is output at a corresponding position to display a pixel of the image. In other examples, the display system may operate in a mode in which a light pulse corresponds to two or more pixels. As described in more detail below, scanning mirror display system may dynamically change between display modes.

A light pulse may be defined by light pulse characteristics such as an intensity level, pulse width (i.e., pulse duration), pulse shape, and/or other suitable pulse characteristic(s). In some examples, the pulse shape and width may be standard, and the transmitted intensity information may comprise an intensity at which to illuminate each color of light source 110. In other examples, the intensity information may comprise intensity and pulse shape information.

As mentioned above, scanning mirror 108 is driven by analog circuit 106 to oscillate substantially at a resonant frequency. Due to factors such as manufacturing tolerances and lot-to-lot variances, the resonant frequency may not be an exact multiple of the image frame rate of video content from video source 120. Furthermore, the resonant frequency of scanning mirror 108 may vary over time with temperature, or due to other factors. Thus, as discussed above, digital circuit 102 may determine a timing for each light pulse and communicates the timing along with the intensity information to the analog circuit 106 to help ensure that pixels are illuminated in correct corresponding locations. Digital circuit 102 may, for example, determine a pixel phase based on the horizontal coordinate of the pixel within a scan line. Then, based on the resonant frequency and sinusoidal motion of scanning mirror 108, digital circuit 102 determines the timing information for the light pulse associated with the pixel such that the light pulse is output at the appropriate time during the traversal of the mirror across the scan line. In some examples, the timing information may be referenced to a most recent zero-crossing of the scanning mirror.

Scanning mirror display system 100 may be configured to output video at frame rates of 30 Hz or greater (e.g., 60 Hz). Depending on the desired image resolution, each raster-scanned image may comprise a large number of scan lines. For example, some 3072×1728 displays may contain 1728 horizontal scan lines of 3072 pixels each. If a desired refresh rate is 30 Hz, the system outputs at least 51,840 scan lines per second and approximately 159 million pixels per second. Other displays may comprise 1440, 1080, 720, or any other number of scan lines. In some example, the desired refresh rate is between 90 and 120 Hz and the system may output approximately 600 million RGB pixels per second. Due to the sinusoidal motion of the scanning mirror, two scan lines are output each period. For example, scan line 202A corresponds to the first half of a period and scan line 202B corresponds to the second half of the period. Thus, a 40 kHz mirror frequency may be able to scan approximately 80,000 lines per second, for example.

As the light pulses are output at specific timings synchronized with the movement of the scanning mirror, the timings may be specified at a relatively high degree of precision to produce accurate pixel positions in the displayed image. In some examples, timing precision may correspond to a pixel placement accuracy of 62.5 picoseconds (ps). Depending on resolution and mirror frequency, a pixel may be between 2-5 nanoseconds (ns) long, i.e., the reflected light beam traverses the pixel in this time period. Thus, a 62.5 ps timing accuracy may achieve pixel position accuracy between $1/32^{nd}$ and $1/80^{th}$ of a pixel-pixel spacing. In view of the level of accuracy at which timing information is specified, a raw, unencoded timestamp may comprise a size of between 12 and 30 bits in some examples, and between 20-22 bits in more specific examples. Thus, power savings may be achieved by compressing the data to decrease the bandwidth used in transmitting the timing information. Due to accuracy requirements discussed above, it is beneficial for the compression/decompression algorithm to be lossless.

While the raw timestamp may comprise a larger number of bits, the time differential between light pulses may be defined in a fewer number of bits. Thus, a timing for a pixel may be encoded as a derivative. Further, in a resonant scanning mirror system, due to the harmonic oscillation of the mirror, the mirror moves relatively slower near the beginning/end of a scan line, and moves faster in the middle of a scan line. In the middle of the scan line the velocity of the mirror may vary only a relatively small degree. As such, the second derivative of the timing data, representing mirror acceleration, may be defined using an even fewer number of bits across much of a scan line. Additionally, encoding second derivatives using a lossless variable-length encoding scheme may offer further reductions in bit length.

FIG. 3 schematically shows an example timestamp encoding scheme 300 using first and second derivatives. The raw timestamp 302 represents the absolute timestamp value. The numbers used in FIG. 3 are arbitrary and for illustrative purposes only, and may not depict realistic timing values that would be communicated. Timing values may be expressed any suitable timing unit, such as picoseconds, nanoseconds, or clock cycles, among other possible units. Any suitable number of bits may be used that achieves the desired numerical accuracy. In one illustrative example, 22 bits are used to represent the value of a raw time stamp, comprising 16 bits indicating an integer unit-time value and 6 bits indicating a fractional unit-time value. Any suitable lesser number of bits may be used to represent first derivative 304. For example, depending on mirror frequency, 8 to 12 bits may be used to represent each first derivative value. Still fewer bits may be used for second derivative values, as described below.

The first timestamp value for the first sample in a scan line may be sent explicitly as an absolute timestamp value, illustrated as raw timestamp 302, using a larger number of bits. The first derivative 304 represents the rate of change of the absolute timing values between adjacent samples. The second timestamp, "1115", thus may be sent, not as a raw timestamp, but encoded as a first derivative. The first derivative of the second sample is calculated as "115" representing the difference between the raw timestamps of the first and second samples. The first derivative 304 may be represented using a smaller number of bits. The third timestamp next may be encoded and sent as a second derivative 306 based upon the rate of change of the second sample timing compared to the rate of change of the third sample timing. Thus, second derivative 306 represents differences between values of the first derivative 304. For example, the second derivative for the third sample is shown as "−3", representing the difference between the first derivatives of the second and third samples.

In some instances, there may be first derivative values that cannot be properly represented using the fewer number of bits. Furthermore, there may be gaps between light pulses that require escaping out of the derivative modes. As such, some first derivative values may be reserved as special command codes to, e.g., change encoding (e.g. by switching to a different codebook) or escape encoding. For example, a first derivative of value 1 may be reserved for a command code, as the value may be unlikely to occur during encoding. As one illustrative example, a first derivative value of 1 may comprise an escape code which exits first derivative encoding. Such an escape code thus indicates to a receiving device (i.e., analog circuit 106) that the next timestamp value will comprise a raw timestamp using a greater bit length rather than an encoded first derivative.

The receiver (e.g., analog circuit 106) may decode the timing information by computing a first or second anti-derivative, as appropriate, to recover the encoded timing value. Subsequent values may also be interpreted as second derivatives unless a command is received indicating a reversion to a first derivative, raw timestamp, or other encoding.

In some examples, the second derivative 306 may be encoded using a lossless variable-length encoding scheme. FIG. 4 depicts example codebooks 400 which employ such variable-length encoding schemes. Codebook 410 is an example encoding scheme based on a variable-length Huffman code. Here, more frequently occurring values of +1 and −1 are encoded using the 2-bit codes "00" and "01", respectively. In some examples, a frequent value may be encoded using 1 bit. Other, less frequent values may be represented by greater bit lengths. By assigning frequent second derivative values to the shorter codes, bandwidth savings may be achieved. For example, if the raw timestamp comprises 30-bits and the encoded second derivative values comprise an average bit length of 1.5 bits, a compression ratio of up to 20× may be achieved.

Example codebook 420 also utilizes a variable-length Huffman code. Codebook 420 is a larger codebook compared to codebook 410 and is capable of encoding more values. For example, second derivative values of ±4 and ±5 cannot be encoded by codebook 410, but can be encoded by codebook 420. However, codebook 420 comprises a greater bit-depth compared to codebook 410. For example, the value "+1" is encoded with the 3-bit code "000" in codebook 420. Thus, encoding "+1" via codebook 420 requires a higher bit count compared to codebook 410.

Codebook 410 and codebook 420 each comprises an "ESC" command code, which may indicate to a receiver to escape the encoding scheme and/or to expect differently formatted information to be sent. If a second derivative value cannot be encoded using the codebook, the method may instead utilize the ESC command code to revert to a raw timestamp, first derivative, or other encoding scheme. Codebooks may comprise other such command codes not listed here.

Codebooks 400 may also comprise additional codebooks, such as additional codebook 430. Huffman codebooks may derive from any suitable Huffman tree. Alternative codebooks may be built from, and tailored to, specific video image data types (e.g., user interfaces or textual displays), specific display modes, or other specific purpose, and a scanning display system may be configured to switch between codebooks based upon various factors. For example, different codebooks may be used for mirrors with different resonant frequency ranges. Also, codebooks may be dynamically switched based upon display modes (e.g. a different code book may be used for a reduced resolution mode in which adjacent pixels are combined into single pixels). As another example, encoding may switch between codebooks based upon a frequency of sending a plurality of scan line termination commands. For example, if a frequency of scan line termination commands per scan line is above a threshold, the scanning display device may change to a second encoding scheme utilizing a second codebook comprising a higher bit count than a first codebook that lead to the high frequency of scan line termination commands. Codebooks may comprise any suitable number of value-code pairs encoded using any suitable bit length. For example, while codebook 410 has a maximum bit length of 4-bits, additional codebook 430 may comprise a Huffman codebook with a maximum bit length of 8-bits.

FIG. 5 depicts an example of a Huffman code sequence comprising second derivative values 500 encoded as second derivative values 502 via codebook 410. The variable-length encoding scheme allows significant compression to be achieved compared to encoding raw timestamps for the example bit lengths described above.

Figure 6:
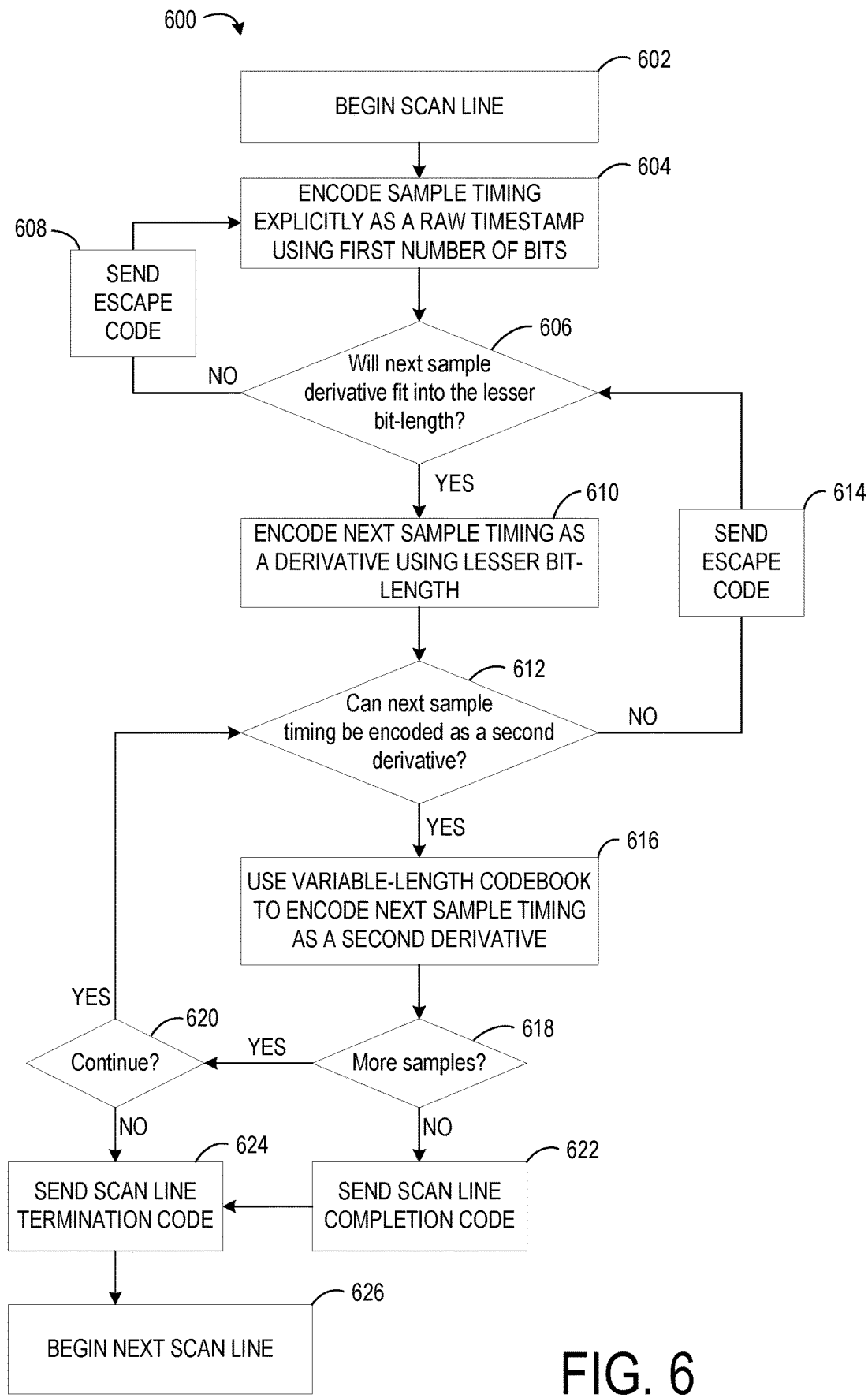
FIG. 6 shows a flow diagram illustrating an example method for encoding timing information.

FIG. 6 shows a flow diagram depicting an example method 600 for encoding timing information for light pulses of a scanning mirror display system. As discussed above, the encoding of timing information may be lossless to maintain a target accuracy in timing values. At 602, method 600 begins a scan line. At 604, the timing information for the first sample is encoded as a raw timestamp using a first number of bits, such as between 20 and 22 bits. At 606, method 600 determines whether the first derivative for the next sample timing can be encoded using a lesser number of bits. For example, the first derivative bit length may be limited to 10 bits. If not, method 600 comprises, at 608, sending an escape code as described above and then sending timing information for the next sample explicitly as a raw timestamp. On the other hand, if the encoded first derivative will fit into the lesser bit length, method 600 proceeds to 610.

At 610, method 600 encodes the next sample timing information as a first derivative using a lesser bit length. Continuing, method 600 attempts to encode subsequent timing information as encoded second derivatives where the numbers to be encoded are suitable. Thus, at 612, method 600 checks whether the second derivative can be encoded as a second derivative via a variable length codebook being used. For example, codebook 410 may be able to encode second derivative values from −3 to +3, while values outside that range cannot be expressed using codebook 410. If the value cannot be properly encoded, method 600 sends an escape code at 614 and then returns to 606. If the second derivative can be properly encoded, method 600 proceeds to 616 and uses the variable-length codebook to encode the next sample timing as second derivative.

If, at 618, there are more samples to be encoded and, at 620, it is determined that encoding of the scan line should continue (e.g. the samples fit within a bandwidth allocation for the scan line), method 600 returns to 612 to check if the next sample timing can be encoded as a second derivative. If the timing information maintains proper encoding, method 600 will continue to encode sample timing information as second derivative using the variable length codebook.

On the other hand, if the scan line encoding is complete and it is determined at 618 that there are no more samples to be sent, method 600 comprises sending a scan line completion code at 622 and a scan line termination code at 624. In other examples, any other suitable codes may be sent to indicate an end of a scan line. Method 600 then proceeds from 624 to 626 and begins encoding the next scan line.

On the other hand, if it is determined at 620 that encoding of the scan line should not continue (e.g. if an allocated bandwidth will be exceeded by continued encoding and transmission of sample data for the scan line), method 600 may, at 620, determine not to continue and instead terminate the encoding process. In this case, method 600 may send a scan line termination code at 624 without sending a scan line completion code. This may indicate to a receiver that the scan line was not completed.

As mentioned above with regard to process 620, in some instances encoded timing information for a scan line might not fit into the bandwidth allocation for that scan line. For example, if the encoded timing information includes a large number of escape codes and encoded first derivative values and/or raw timing values instead of shorter bit length encoded second derivative values, the compression ratio of the encoded timing information may not be sufficiently high in view of the allocated bandwidth. As such, FIG. 7 shows a flow diagram depicting an example method for monitoring and terminating an encoding process.

Figure 7:
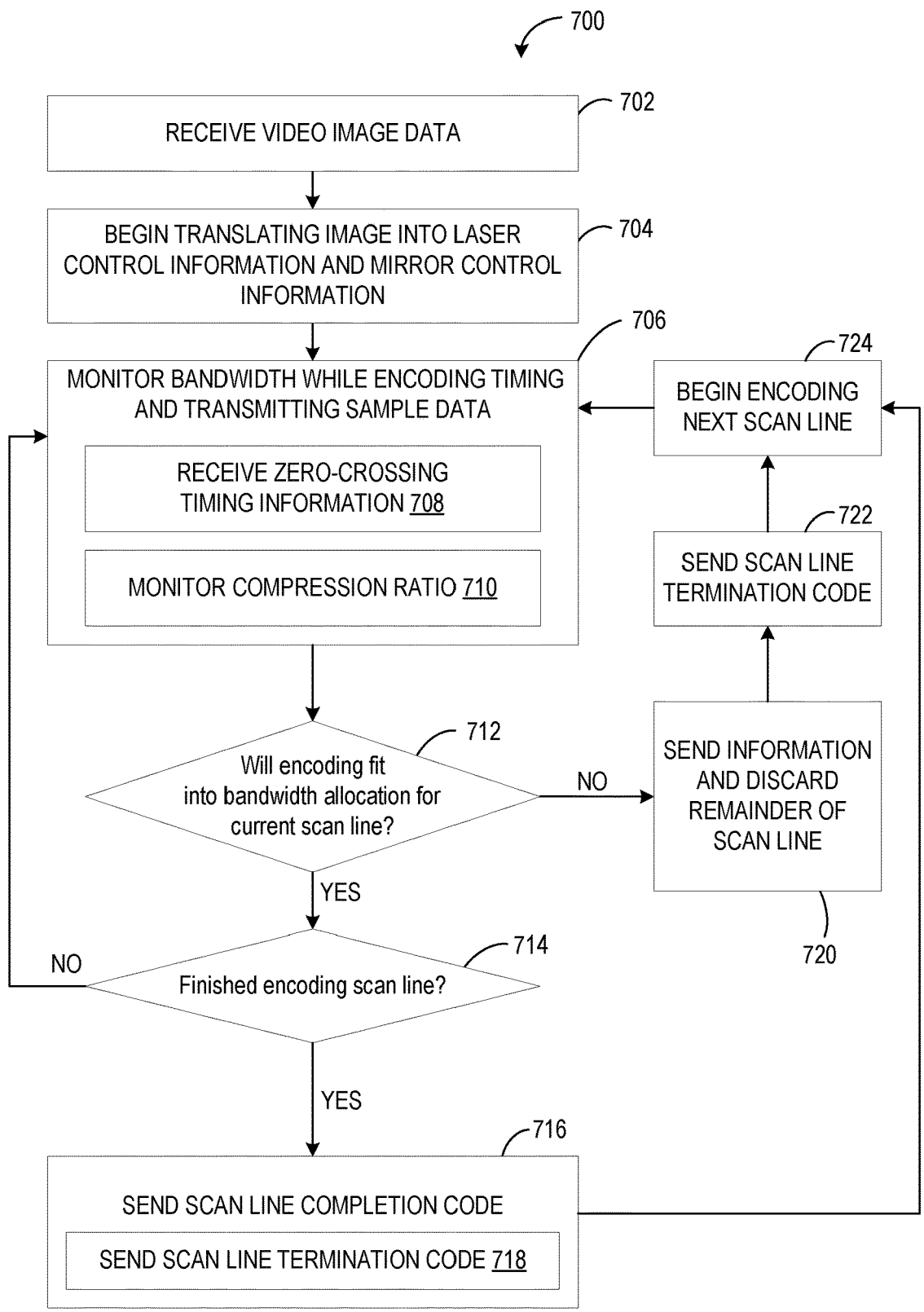
FIG. 7 shows a flow diagram illustrating an example method for monitoring and terminating encoding of a scan line.

FIG. 7 schematically shows an example method 700 for monitoring encoding progress and terminating encoding when one or more trigger conditions are met. Method 700 may be enacted on scanning mirror display system 100, for example. At 702, method 700 comprises receiving video image data. Image data may be received from video source 120, for example. Next, at 704, method 700 begins translating image data into laser control information and mirror control information. At 706, method 700 comprises monitoring bandwidth while encoding the timing information and transmitting the intensity and encoded timing data for samples. In some examples, at 708, the method may receive zero-crossing timing information for each scan line, which may comprise receiving a reference time from analog circuit driver 106. In other examples, zero-crossing timings may be communicated less frequently and/or may be known based upon the resonant scanning frequency of the mirror.

Monitoring the bandwidth at 706 may comprise, at 710, monitoring the compression ratio. At 712, method 700 comprises determining whether the encoding will fit into the bandwidth allocation for the current scan line. This may comprise, for example, comparing the encoding progress to a remaining time before the start of the next scan. Such a comparison may also be based upon a known encoding latency. Process 712 also may comprise comparing the compression ratio to a threshold compression ratio. If at 712 the method determines that the encoding will fit into the bandwidth allocation, the method loops from 714 to 706 until scanning is completed, at which point method 700 comprises sending a scan line completion code at 716. Process 716 may further comprise, at 718, sending a scan line termination code. In other examples, any other suitable line termination codes may be used. The method will then proceed to 724 to begin encoding the next scan line, and then to 706 to encode and monitor the encoding progress of the next scan line.

On the other hand, if it is determined at 712 that the intensity and encoded timing information for a current scan line will not fit within the bandwidth allocated for the scan line, method 700 terminates the encoding of the scan line at 720, the intensity and timing information encoded thus far is sent to the receiver across the communications channel, and any remaining information is discarded. At 722, method 700 sends a scan line termination code which indicates to the receiver that a new scan line will be transmitted. Then, at 724, the method begins encoding the next scan line and returns to 706 to encode and monitor the encoding progress of the next scan line.

Figure 8A:
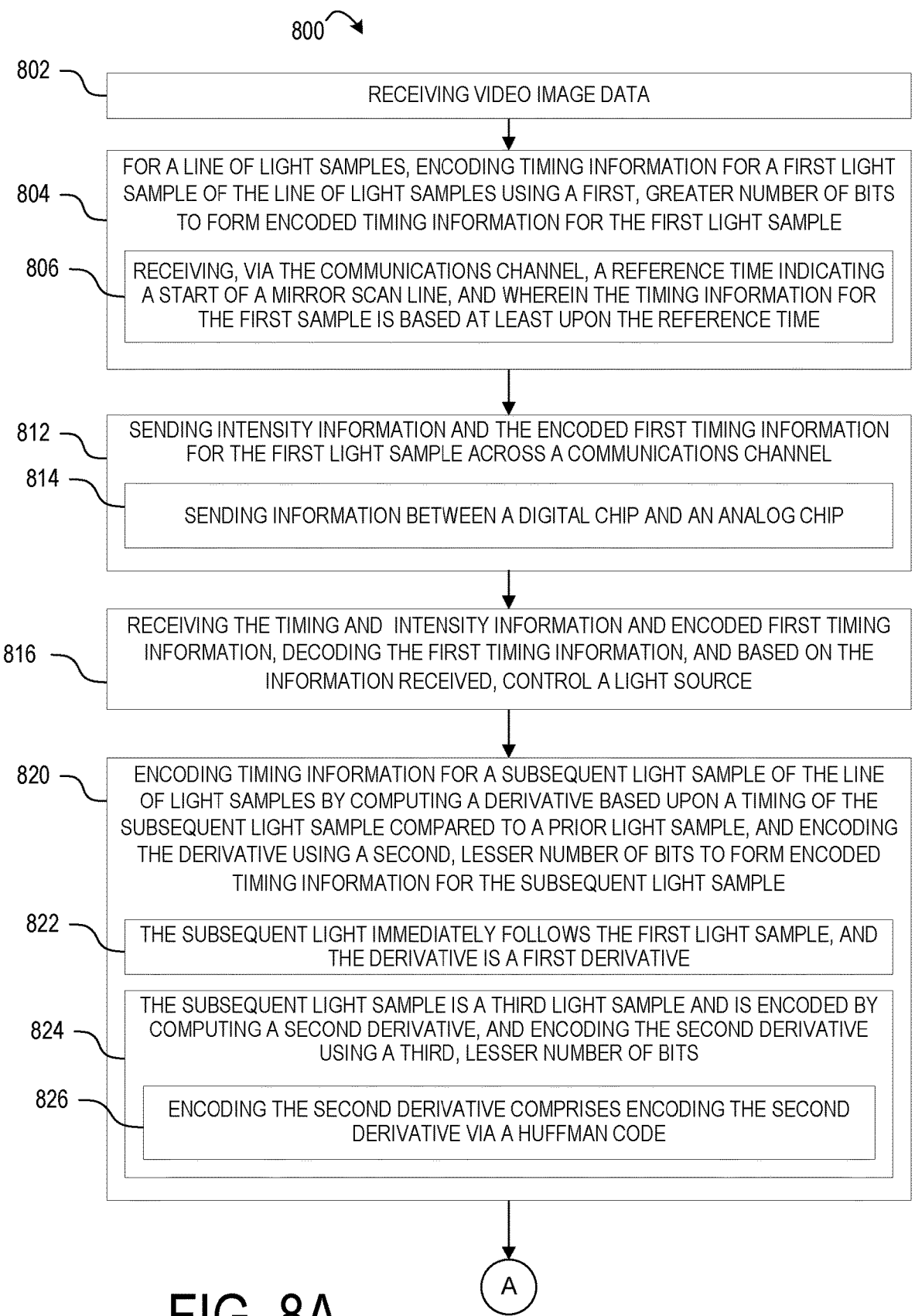
FIGS. 8A and 8B show an example method for encoding timing information using a derivative-based encoding scheme.

FIG. 8 shows a flow diagram depicting an example method 800 for communicating timing information for light samples in a scanning mirror display system. Method 800 may be enacted on scanning mirror display system 100, as an example. Method 800 comprises, at 802, receiving video image data. Method 800 further comprises, at 804, for a line of light samples, encoding timing information for a first light sample of the line of light samples using a first, greater number of bits to form encoded timing information for the first light sample. In some examples, a reference time used to produce the timing information for the first light sample is received from another device, such as an analog circuit 106. As such, at 806, method 800 may comprise receiving, via a communication channel, a reference time indicating a start of a mirror scan line, such that the timing information for the first sample is based at least upon the reference time.

Continuing, method 800 comprises, at 812, sending intensity information and the encoded first timing information for the first light sample across a communications channel. In some example, method 800 comprises, at 812, sending information across a communications channel comprises sending information between a digital chip and an analog chip. In some examples, at 814, sending information across the communications channel comprises sending information between a digital circuit and an analog circuit (e.g. a digital image processor and a laser driver circuit).

Method 800 further comprises, at 816, receiving intensity information and encoded first timing information at a receiving device (e.g. an analog circuit as described above), decoding the first timing information, and based on the information received, controlling a light source.

Method 800 further comprises, at 820, encoding timing information for a subsequent light sample of the line of light samples by computing a derivative of the timing information, and encoding the derivative using a second, lesser number of bits to form encoded timing information for the subsequent light sample. The subsequent light sample may be a second light sample that immediately follows the first light sample, as indicated at 822. In such examples, the derivative may be a first derivative. The subsequent light sample also may be a third (or fourth, or later) light sample, as indicated at 824. In this instance, method 800 comprises encoding a timing for the subsequent light sample by computing a second derivative, and encoding the second derivative using a third, lesser number of bits. In some such examples, encoding the second derivative comprises encoding the second derivative via a Huffman code or other variable length codebook, as indicated at 824.

Figure 8B:
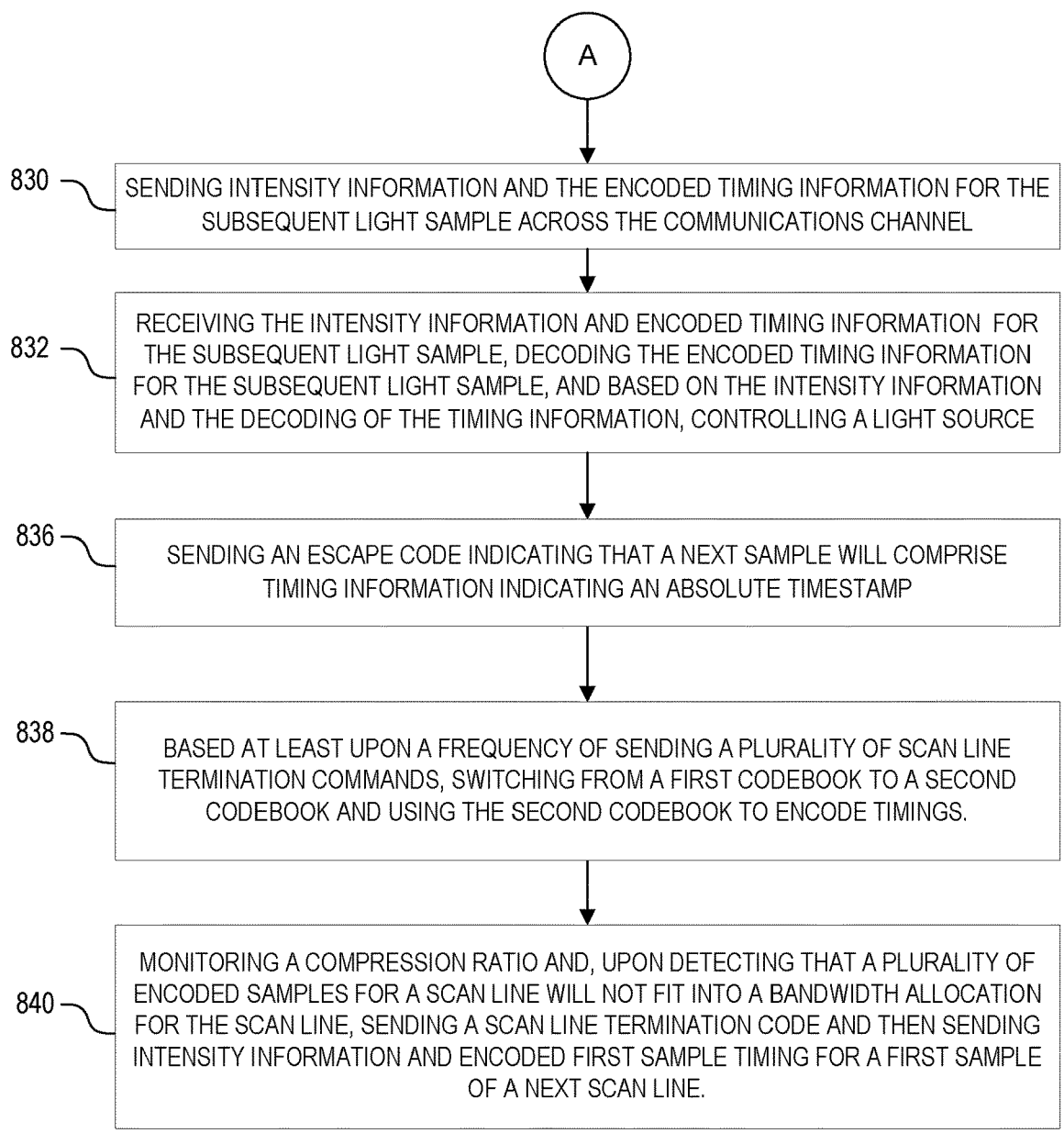

Continuing with FIG. 8B, method 800 further comprises, at 830, sending intensity information and the encoded timing information for the subsequent light sample across the communications channel. Method 800 further comprises, at 832, receiving the intensity information and encoded timing information at a receiving device (e.g. an analog circuit), decoding the encoded timing information for the subsequent light sample, and based on the intensity information and the decoded timing information, controlling emission of a light pulse by a light source to display a pixel of an image. If the subsequent sample immediately follows a raw timestamp, the method may treat the encoded timing information as a first derivative and decode the encoded timing information for the subsequent sample using an anti-derivative, e.g., the method may add the derivative value to the previous timestamp to recover the raw timestamp for the subsequent sample. If the subsequent sample immediately follows a sample encoded using a first derivative, then the method may treat the encoded timing information for the subsequent sample as a second derivative and decode the timing information using a codebook and/or computing a second anti-derivative to recover the raw timestamp for the subsequent sample.

As described above, in some examples, method 800 further comprises, at 836, sending an escape code indicating that a next sample will comprise timing information indicating an absolute timestamp. This may occur, for example, where it is determined that the derivative will not fit within a bit length for the derivative.

Further, in some examples, at 838, the timing information is encoded using a first codebook and the method 800 further comprises, based at least upon a frequency of sending a plurality of scan line termination commands, switching to a second codebook, the second codebook comprising a higher bit count than the first codebook, and using the second codebook to encode timings.

Additionally, in some examples, method 800 comprises, at 840, monitoring a compression ratio and, upon detecting that a plurality of encoded samples for a scan line will not fit into a bandwidth allocation for the scan line, sending a scan line termination code and then sending intensity information and encoded first sample timing for a first sample of a next scan line.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
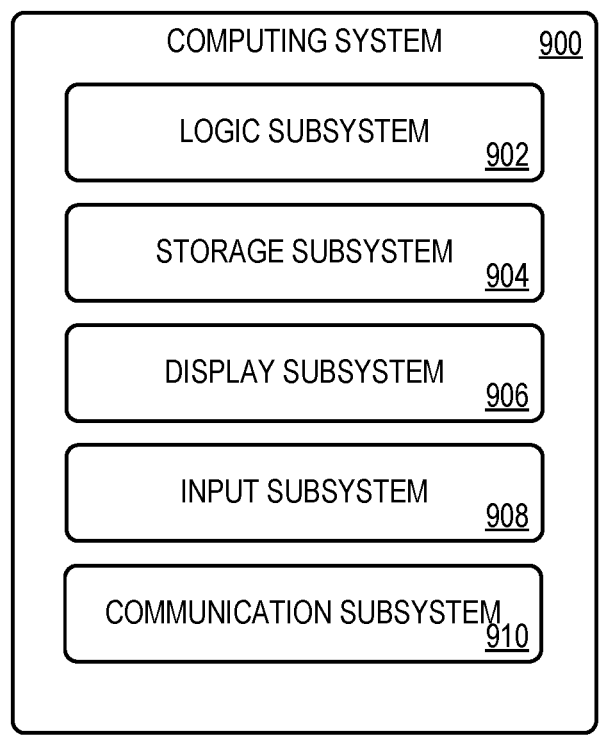
FIG. 9 shows a block diagram of an example computing system.

FIG. 9 schematically shows a non-limiting embodiment of a computing system 900 that can enact one or more of the methods and processes described above. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices. FIG. 9 may represent a computing system incorporating the scanning display device 100 of FIG. 1, for example.

Computing system 900 includes a logic subsystem 902 and a storage subsystem 904. Computing system 900 may optionally include a display subsystem 906, input subsystem 908, communication subsystem 910, and/or other components not shown in FIG. 9.

Logic subsystem 902 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage subsystem 904 includes one or more physical devices configured to hold instructions executable by the logic machine to implement the methods and processes described herein. When such methods and processes are implemented, the state of storage subsystem 904 may be transformed—e.g., to hold different data.

Storage subsystem 904 may include removable and/or built-in devices. Storage subsystem 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppydisk drive, tape drive, MRAM, etc.), among others. Storage subsystem 904 may include volatile, nonvolatile, dynamic, static, read/write, read-only, random-access, sequential-access, location-addressable, file-addressable, and/or content-addressable devices.

It will be appreciated that storage subsystem 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 902 and storage subsystem 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 906 may be used to present a visual representation of data held by storage subsystem 904. This visual representation may take the form of a graphical user interface (GUI). As the herein described methods and processes change the data held by the storage machine, and thus transform the state of the storage machine, the state of display subsystem 906 may likewise be transformed to visually represent changes in the underlying data. Display subsystem 906 may include one or more display devices utilizing virtually any type of technology. For example, display subsystem 906 may comprise scanning mirror display system 100. Such display devices may be combined with logic subsystem 902 and/or storage subsystem 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

Another example provides, on a scanning mirror display system, a method of communicating timing information for light samples that are scanned to form a displayed image, the method comprising, for a line of light samples, encoding timing information for a first light sample of the line of light samples using a first, greater number of bits to form encoded timing information for the first light sample; sending intensity information and the encoded first timing information for the first light sample across a communications channel; encoding timing information for a subsequent light sample of the line of light samples by computing a derivative based upon a timing of the subsequent light sample compared to a prior light sample, and encoding the derivative using a second, lesser number of bits to form encoded timing information for the subsequent light sample; and sending intensity information and the encoded timing information for the subsequent light sample across the communications channel. The method may additionally or alternatively comprise, wherein the subsequent light sample is a second light sample that immediately follows the first light sample, and wherein the derivative is a first derivative. In some such examples, the method may additionally or alternatively comprise encoding a timing for a third light sample by computing a second derivative, and encoding the second derivative using a third, lesser number of bits. In some such examples, encoding the second derivative may additionally or alternatively comprise encoding the second derivative via a Huffman code. In some such examples, the Huffman code may additionally or alternatively comprise a codebook with a maximum bit length between 8 bits and 12 bits. In some such examples, the method may additionally or alternatively comprise sending an escape code indicating that a next sample will comprise timing information indicating an absolute timestamp. In some such examples, sending information across a communications channel may comprise sending information between a digital circuit and an analog circuit. In some such examples, the method may additionally or alternatively comprise receiving, via the communications channel, a reference time indicating a start of a mirror scan line, and wherein the timing information for the first sample is based at least upon the reference time. In some such examples, a light sample corresponds to a pixel of the displayed image, and the timing information for the light sample corresponds to a pixel position accuracy of between $\frac{1}{16}$th and $\frac{1}{80}$th of a pixel-to-pixel spacing. In some such examples, the intensity information and timing information for the first light sample and the intensity information and encoded timing information for the subsequent light sample are sent by a digital circuit to an analog circuit, and the method may additionally or alternatively comprise receiving the intensity information and timing information for the first light sample and the intensity information and encoded timing information for the second light sample at the analog circuit, wherein receiving encoded timing information comprising the second, lesser number of bits indicates to the analog circuit that the encoded timing information comprises an encoded derivative. In some such examples, the method may additionally or alternatively comprise decoding the encoded timing information for the subsequent light sample, and based on the intensity information and the decoding of the timing information, controlling a light source.

Another example provides a scanning mirror display system, comprising a light source; a resonant scanning mirror configured to scan light from the light source across a field of view with a variable speed that is a function of mirror scanning angle; a logic subsystem configured to execute instructions; a communication subsystem; and a storage subsystem comprising instructions that are executable by the logic subsystem to encode a first sample timing explicitly using a first number of bits to form an encoded first sample timing; send intensity information for the first sample and the encoded first sample timing across a communications channel via the communication subsystem;

encode a second sample timing as first derivative based upon the second sample timing compared to the first sample timing to form an encoded second sample timing, the encoded second sample timing being encoded using a second number of bits that is lesser than the first number of bits; send intensity information for the second sample and the encoded second sample timing via the communication subsystem; encode a third sample timing as second derivative based upon a rate of change of a second sample timing compared to a rate of change of a third sample timing to form an encoded third sample timing, the encoded third sample timing being encoded using a third number of bits that is lesser than the second number of bits; and send intensity information for the third sample and the encoded third sample timing via the communication channel. In some such examples, the scanning mirror display system may additionally or alternatively comprise instructions executable to encode a fourth sample timing as second derivative based upon rate of change of the third sample timing compared to a rate of change of the fourth sample timing. In some such examples, the scanning mirror display system may additionally or alternatively comprise instructions executable to monitor a compression ratio and, upon detecting that a plurality of encoded samples for a scan line will not fit into a bandwidth allocation for the scan line, send a scan line termination code and then send intensity information and encoded first sample timing for a first sample of a next scan line. In some such examples, the scanning mirror display system may additionally or alternatively comprise instructions executable to encode the third sample timing using a Huffman codebook. In some such examples, the storage subsystem stores a plurality of codebooks, and the codebook is selected based upon one or more of a frequency of the resonant scanning mirror or a scanning mode of the scanning mirror display system.

Another example provides a scanning mirror display system comprising one or more light sources; a resonant scanning mirror configured to scan light from the one or more light sources across a field of view with a variable speed that is a function of mirror scanning angle; a communication subsystem; a logic subsystem configured to execute instructions; a storage subsystem holding instructions that are executable to send, via the communications subsystem, sample information for a mirror scan line, the sample information comprising timings encoded using a derivative-based encoding scheme, monitor an encoding progress, determine, based at least upon a comparison of the encoding progress to a remaining time before a next mirror scan line, that the sample information for the mirror scan line will not fit into bandwidth allocated for the mirror scan line, and in response, send a scan line termination command. In some such examples, the scanning mirror display system may additionally or alternatively comprise instructions executable to determine that the sample information for the mirror scan line will not fit into bandwidth allocated for the mirror scan line further based upon a known encoding latency. In some such examples, the derivative-based encoding scheme is a first encoding scheme comprising a first codebook, and the instructions are further executable to, based at least upon a frequency of sending a plurality of scan line termination commands, change to a second encoding scheme, the second encoding scheme being a derivative-based encoding scheme comprising a second codebook, the second codebook comprising a higher bit count than the first codebook, and use the second encoding scheme to encode timings. In some such examples, the first codebook uses a first bit length for encoding second derivatives, and the second codebook uses a second bit length for encoding second derivatives, the second bit length greater than the first bit length.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. On a scanning mirror display system, a method of communicating timing information for light samples that are scanned to form a displayed image, the method comprising:
   for a line of light samples, receiving via a communications channel intensity information and encoded first timing information for a first light sample of the line of light samples, the encoded first timing information encoded via a first, greater number of bits;
   decoding the encoded first timing information to form decoded timing information for the first light sample;
   receiving via the communications channel intensity information and encoded timing information for a subsequent light sample of the line of light samples, the encoded timing information for the subsequent light sample encoded via a second, lesser number of bits; and
   decoding the encoded timing information for the subsequent light sample by decoding the encoded timing information of the subsequent light sample to form decoded timing information for the subsequent light sample, and computing an anti-derivative based upon the decoded timing information of the subsequent light sample, the anti-derivative indicating a timing of the subsequent light sample compared to a prior light sample.

2. The method of claim 1, wherein the subsequent light sample is a second light sample that immediately follows the first light sample, and wherein the anti-derivative is a first anti-derivative.

3. The method of claim 2, further comprising receiving encoded timing information for a third light sample encoded via a third, lesser number of bits, and decoding the encoded timing information for the third light sample by computing a second anti-derivative.

4. The method of claim 3, wherein decoding the encoded timing information for the third light sample comprises decoding via a Huffman code.

5. The method of claim 4, wherein the Huffman code comprises a codebook with a maximum bit length between 8 bits and 12 bits.

6. The method of claim 1, further comprising receiving an escape code indicating that a next sample will comprise timing information indicating an absolute timestamp.

7. The method of claim 1, wherein receiving via the communications channel the intensity information and the encoded timing information comprises receiving the intensity information at an analog circuit.

8. The method of claim 1, further comprising controlling a light source based on the intensity information and timing information obtained from decoding the encoded timing information.

9. The method of claim 1, further comprising receiving, via the communications channel, a reference time indicating a start of a mirror scan line, and wherein the encoded first timing information for the first light sample is based at least upon the reference time.

10. The method of claim 1, wherein a light sample corresponds to a pixel of the displayed image, and wherein the decoded timing information for the light sample corresponds to a pixel position accuracy of between $\frac{1}{16}$th and $\frac{1}{80}$th of a pixel-to-pixel spacing.

11. A scanning mirror display system, comprising:
a light source;
a resonant scanning mirror configured to scan light from the light source across a field of view with a variable speed that is a function of mirror scanning angle;
a logic subsystem;
a communication subsystem; and
a storage subsystem comprising instructions that are executable by the logic subsystem to:
receive, via the communication subsystem, intensity information for a first sample and encoded first sample timing, the encoded first sample encoded via a first number of bits;
decode the encoded first sample timing explicitly;
receive, via the communication subsystem, intensity information for a second sample and encoded second sample timing, the encoded second sample timing encoded via a second number of bits that is lesser than the first number of bits;
decode the encoded second sample timing as a first anti-derivative indicating a timing of the second sample compared to a timing of the first sample;
receive intensity information for a third sample and encoded third sample timing via the communication subsystem, the encoded third sample timing encoded via a third number of bits that is lesser than the second number of bits;
decode the encoded third sample timing as a second anti-derivative indicating a rate of change of a timing of the second sample compared to a rate of change of a timing of the third sample.

12. The scanning mirror display system of claim 11, wherein the instructions are further executable to decode an encoded fourth sample timing as a second anti-derivative indicating a range of change of a timing of a fourth sample compared to a rate of change of a timing of the third sample.

13. The scanning mirror display system of claim 11, wherein the instructions are further executable to receive a scan line termination code and then receive intensity information and encoded first sample timing for a first sample of a next scan line.

14. The scanning mirror display system of claim 11, wherein the instructions are executable to decode the encoded third sample timing using a Huffman codebook.

15. The scanning mirror display system of claim 14, wherein the storage subsystem stores a plurality of codebooks, and wherein the Huffman codebook is selected from the plurality of codebooks based upon one or more of a frequency of the resonant scanning mirror or a scanning mode of the scanning mirror display system.

16. A scanning mirror display system, comprising:
one or more light sources;
a resonant scanning mirror configured to scan light from the one or more light sources across a field of view with a variable speed that is a function of mirror scanning angle;
a communication subsystem;
a logic subsystem; and
a storage subsystem comprising instructions that are executable by the logic subsystem to:
for a line of light samples, receive, via the communication subsystem, intensity information and encoded first timing information for a first light sample of the line of light samples, the encoded first timing information encoded via a first, greater number of bits;
decode the encoded first timing information to form decoded timing information for the first light sample;
receive, via the communication subsystem, intensity information and encoded timing information for a subsequent light sample of the line of light samples, the encoded timing information for the subsequent light sample encoded via a second, lesser number of bits; and
decode the encoded timing information for the subsequent light sample by decoding the encoded timing information of the subsequent light sample to form decoded timing information for the subsequent light sample, and computing an anti-derivative based upon the decoded timing information of the subsequent light sample, the anti-derivative indicating a timing of the subsequent light sample compared to a prior light sample.

17. The scanning mirror display system of claim 16, wherein the instructions are further executable to receive a scan line termination command.

18. The scanning mirror display system of claim 16, wherein the subsequent light sample is a second light sample that immediately follows the first light sample, and wherein the anti-derivative is a first anti-derivative.

19. The scanning mirror display system of claim 16, wherein the instructions are further executable to receive encoded timing information for a third light sample encoded via a third, lesser number of bits, and decode the encoded timing information for the third light sample by computing a second anti-derivative.

20. The scanning mirror display system of claim 19, wherein the instructions are further executable to decode the encoded timing information for the third light sample using a Huffman code book before computing the second anti-derivative.

* * * * *